United States Patent [19]

Glumov et al.

[11] 4,307,401
[45] Dec. 22, 1981

[54] TWO-CHANNEL RECEIVER-INDICATOR FOR PHASE RADIO SYSTEMS

[76] Inventors: Ivan F. Glumov, ulitsa Kotovskogo, 13, kv. 59; Viktor P. Maiko, ulitsa Pionerskaya, 6, kv. 5; Valery I. Ziberov, ulitsa Polevaya, 24, kv. 29; Nikolai A. Yaroslavtsev, ulitsa Ulyanovskaya, 82, all of, Gelendzhik Krasnodarskogo kraya, U.S.S.R.

[21] Appl. No.: 102,978

[22] Filed: Dec. 11, 1979

[51] Int. Cl.³ .............................................. G01S 5/02
[52] U.S. Cl. ................................. 343/114; 343/105 R
[58] Field of Search ..................... 343/103, 114, 105 R

[56] References Cited

U.S. PATENT DOCUMENTS 4,114,155  9/1978  Raab ..................................... 343/103

Primary Examiner—Theodore M. Blum
Attorney, Agent, or Firm—Steinberg & Raskin

[57] ABSTRACT

Two of three receivers of a receiver-indicator are tuned to the frequencies of a first guided station and first guiding station, second guided station and second guiding station, respectively, and a third receiver is tuned to the frequency of a repeater station. The first and second receivers are connected to inputs of a first signal shaper for shaping electric signals corresponding to the best frequency between the first guided and guiding stations and to the input of a second signal shaper for shaping electric signals corresponding in the heat frequency between the second guided and guiding stations. The third receiver is connected to a third signal shaper for shaping electric signals corresponding to the beat frequency between the first guided and guiding stations and to a fourth signal shaper for shaping electric signals corresponding to the beat frequency between the second guided and guiding stations. The outputs of the first and third signal shapers are connected to inputs of a first digital follow-up phase meter, and the outputs of the second and fourth signal shapers are connected to the inputs of the second digital follow-up phase meter. Connected to the outputs of the first and second shapers are inputs of digital units for automatic frequency adjustment and multiplication, whose outputs are connected to the inputs of the first and second digital follow-up phase meters. A count pulse generator is connected to other inputs of the automatic frequency adjustment units.

3 Claims, 2 Drawing Figures

TWO-CHANNEL RECEIVER-INDICATOR FOR PHASE RADIO SYSTEMS

FIELD OF APPLICATION OF THE INVENTION

The present invention relates to radio systems for measuring phase difference and, more particularly, to two-channel receiver-indicators of radio phase systems.

The present invention can be used for measuring the phase difference in the phase field of radio navigation systems such as "Poisk" (USSR), "Torane" (France), "Lorac" (USA).

BACKGROUND OF THE INVENTION

At the present time a number of publications are available describing increasing the accuracy of measuring systems by improving the hardware. The development of digital methods and hardware for radio measurements permit a very close approach to the solution of the problem of increasing the accuracy of measuring systems.

Phase heterodyne systems with incoherent radiation of signals are characterized by low stability of the frequencies produced by ground stations. These systems include "Poisk" (USSR), "Torane" (France), "Lorac" (USA). Due to the low frequency stability of the radiation, it is difficult to use a digital measuring structure, since the meter must include sophosticated systems to form a copy of the signal. A simpler technical solution is to provide electromechanical follow-up systems making it possible to measure the difference of the phases of the signals. The follow-up systems are included in the radio system. The compensation phase meters based on an electromechanical system are widely used in the art. Such meters can operate with radio systems having low frequency stability. However, the accuracy and reliability of such measuring devices is low, since it is determined by the characteristics of such mechanical units as reduction gears, gear wheels and toothed and worm transmissions.

The input of information directly from the meter to the computer processing the navigation information is very difficult. The presence of additional mechanical transducers converting the mechanical action into a digital code still further deteriorates the accuracy of measurement of a navigation parameter.

Known in the art is a mobile receiver station of a phase radio navigation system "Lorac" of the Seiscor Company consisting of receivers and an indicator unit based on a phase meter of the compensation follower type with a phase shifter using a selsyn, a motor, a phase detector and a mechanical transmission. The radio navigation parameter is fed to the computer via an analog-code converter. This receiver station permits the measurement of the phase difference in the radio system having low frequency stability of the ground stations. However, the accuracy of the measurements is low due to the use of mechanical components.

Known in the art is a receiver-indicator of the Sercel Company (France). This receiver-indicator includes an input unit connected to an antenna and an output connected to the inputs of RF amplifiers whose output is connected to IF amplifiers through mixers. The other inputs of the mixers are connected to a master oscillator and the outputs of the IF amplifiers are connected through a switch to the first inputs of the readout follower systems whose second inputs are connected to the output of a timing unit. The input of the timing unit is connected to the master oscillator. The outputs of the readout follower systems are electrically connected to the inputs of the phase meters through a switching device.

The aforedescribed receiver-indicator permits accurate measurements, since it is based on a digital measuring structure. However, the measurements can be made only at strictly definite frequencies with high stability of radiation of the ground stations included in the radio system. The use of such a measuring structure for measuring the difference of phases from the signals of ground stations having low frequency stability of radiation would cause great measuring errors.

Well known in the art is a two-channel receiver-indicator for phase radio systems (cf. V. P. Mayko "Requirements Imposed on R-F Phase Meters," "Geodezia i Aerofotos'emka" No. %, 1977, published by Izvestia Vashikh Uchebnykh Zavedeni Publishing House), comprising three receivers, two of which are tuned respectively to the frequencies of the first guided and guiding stations and the second guided and guiding stations of the radio system and are connected to the input of the first signal shaper for shaping electric signals corresponding to the beat frequency between the first guided and guiding stations and to the input of the second signal shaper for shaping electric signals corresponding to the beat frequency between the second guided and guiding stations respectively. The third receiver is tuned to the frequency of the repeater station of the radio system and is connected to the input of the third signal shaper for shaping electric signals corresponding to the beat frequency between the first guided and guiding stations and to the input of the fourth signal shaper for shaping electric signals corresponding to the beat frequency between the second guided and guiding stations. The outputs of the first and third signal shapers are connected to the inputs of a first follow-up phase meter and the outputs of the second and fourth signal shapers are connected to the inputs of the second follow-up phase meter.

In this receiver-indicator, the first and second phase meters measuring the phase difference are electromechanical followers of the compensation type. A phase shifter is a measuring element in the follow-up system. The electromechanical follower comprises a phase detector electrically connected to a motor and a phase shifter, which are mechanically interconnected. The error signal from the output of the phase detector controls the operation of the motor, which rotates the rotor of the phase shifter until the error signal disappears. The angle of rotation of the phase shifter indicates the phase difference.

The aforedescribed receiver-indicator is low in reliability and accuracy due to application of such complex mechanical units as reduction gears, motors and phase shifters included in the electromechanical system.

BRIEF SUMMARY OF THE INVENTION

An object of the present invention is to provide a two-channel receiver-indicator for phase radio systems having a high accuracy of phase measurements with low frequency stability of the ground stations of the radio system.

This object is attained by providing a two-channel receiver-indicator of phase radio systems comprising three receivers, two of which, tuned respectively to the frequencies of the first guided and guiding stations and of the second guided and guiding stations of the radio system, are connected to the input of a first signal shaper for shaping electric signals corresponding to the beat frequency between the first guided and guiding stations and to the input of a second signal shaper for shaping electric signals corresponding to the beat frequency between the second guided and guiding stations respectively. The third receiver, tuned to the frequency of the repeater station of the radio system, is connected to the input of a third signal shaper for shaping electric signals corresponding to the beat frequency between the first guided and guiding stations and to the input of a fourth signal shaper for shaping electric signals corresponding to the beat frequency between the second guided and guiding stations. The outputs of the first and third signal shapers are connected to the inputs of the first follow-up phase meter and the outputs of the second and fourth signal shapers are connected to the inputs of the second follow-up phase meter. In accordance with the invention, the system includes two digital units for automatic frequency adjustment and multiplication, one input of each of which is connected to the output of the first and second signal shapers, respectively, and the output of each of which is connected to the input of the follow-up phase meters. The output of a count pulse generator is connected to the other inputs of the digital units for automatic frequency adjustment and multiplication. The digital follow-up phase meters are used as the follow-up phase meters.

It is expedient that each unit for automatic frequency adjustment and multiplication comprises a first pulse counter, a comparison circuit whose first input is connected to the output of the first pulse counter and whose output is connected to the reset input of said first pulse counter, a second pulse counter whose input is connected to the output of the comparison circuit, and a reversible pulse counter whose adding input is connected to the output of the second pulse counter and whose output is connected to the second input of the comparison circuit.

The proposed two-channel receiver-indicator of the phase radio system permits accurate measurement of the phase difference within a wide frequency range and this permits its use in incoherent radio system networks with low frequency stability of the ground stations of a radio system.

BRIEF DESCRIPTION OF THE DRAWINGS

The present invention is illustrated by some specific embodiments thereof and by the accompanying drawings, in which.

DETAILED DESCRIPTION OF THE INVENTION

Figure 1:
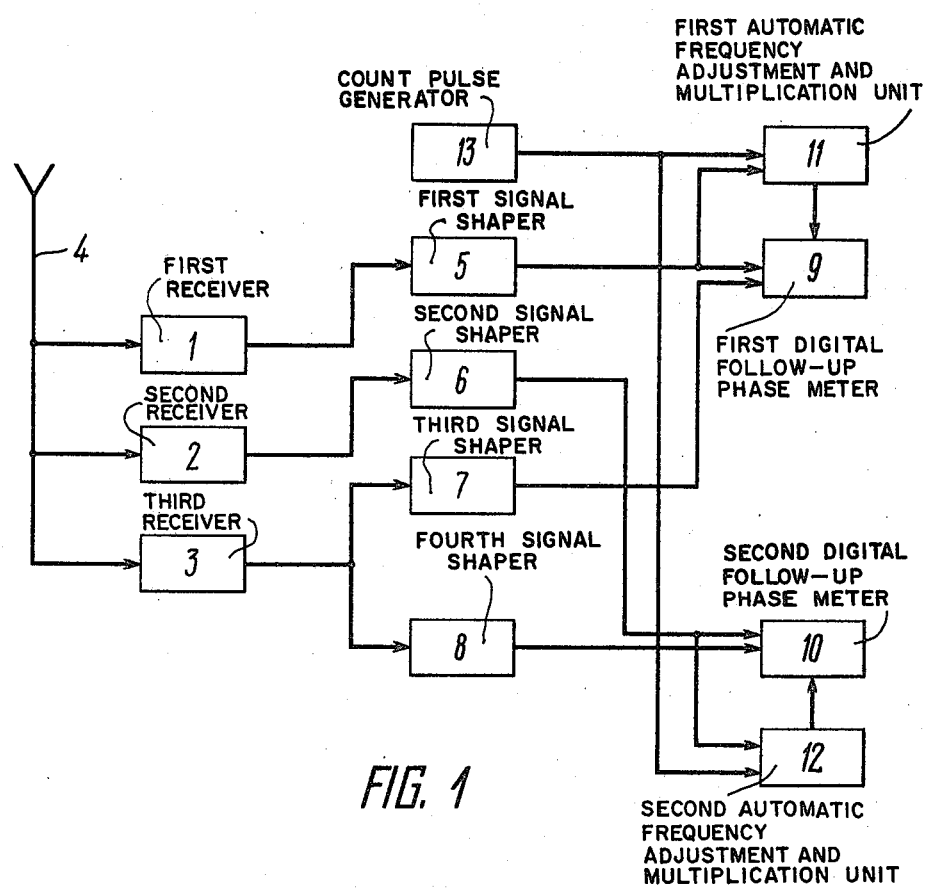
FIG. 1 is a block diagram of the proposed two-channel receiver-indicator according to the invention.

The proposed two-channel receiver-indicator of phase radio systems is intended for use in a phase incoherent heterodyne radio system.

The receiver-indicator includes first, second and third receivers 1, 2 and 3 (FIG. 1) connected to an antenna 4. All three receivers are identical. The first and second receivers 1 and 2 are tuned respectively to the frequency of the first guided and guiding stations and to the frequencies of the second guided and guiding stations of the radio system (not shown). The third receiver is tuned to the frequency of a repeater station of the radio system (not shown).

The receiver-indicator also includes first, second, third and fourth signal shapers 5, 6, 7 and 8 of identical circuits for shaping electric signals. The first and second signal shapers 5, 6 are connected to the outputs of the first and second receivers 1, 2 respectively, and the inputs of the third and fourth signal shapers 7 and 8 are connected to the output of the third receiver 3. The first and third signal shapers 5 and 7 generate pulses with a repetition frequency corresponding to the beat frequency between the first guided and guiding stations of the radio system. The second and fourth signal shapers 6 and 8 generate pulses with a repetition frequency corresponding to the beat frequency between the second guided and guiding stations of the radio system.

The receiver-indicator also comprises first and second digital follow-up phase meters 9 and 10 having identical circuits. The inputs of the first follow-up phase meter 9 are connected to the first and third signal shapers 5 and 7 and the inputs of the second follow-up phase meter 10 are connected to the second and fourth signal shapers 6 and 8.

The first and second automatic frequency adjustment and multiplication units 11 and 12 of the proposed receiver-indicator are connected to the outputs of the first and second signal shapers 5 and 6, respectively, and the outputs of the units 11 and 12 are connected to the inputs of the first and second follow-up phase meters 9 and 10, respectively. A count pulse generator 13 is connected to the second inputs of the automatic frequency adjustment and multiplication units 11 and 12. In the aforedescribed receiver-indicator, each receiver 1, 2 and 3 comprises an RF amplifier 14 (FIG. 2), a mixer 15, an IF amplifier 16 and an amplitude detector 17 connected in series. A master oscillator 18 is connected to the input of the mixer 15.

As hereinbefore mentioned, each of the signal shapers 5, 6, 7 and 8 has the same circuit, each including a low-pass filter 19, an amplifier-limiter 20, a logical and circuit or And gate 21 and a pulse counter 22 connected in series. The output of the amplifier-limiter 20 is also connected to the reset input of a pulse counter 22. The count pulse generator 13 is connected to the second input of the And gate 21 of the signal shapers 5, 6, 7 and 8.

The output of the pulse counter 22 is the output of the signal shapers 5, 6, 7 and 8.

Figure 2:
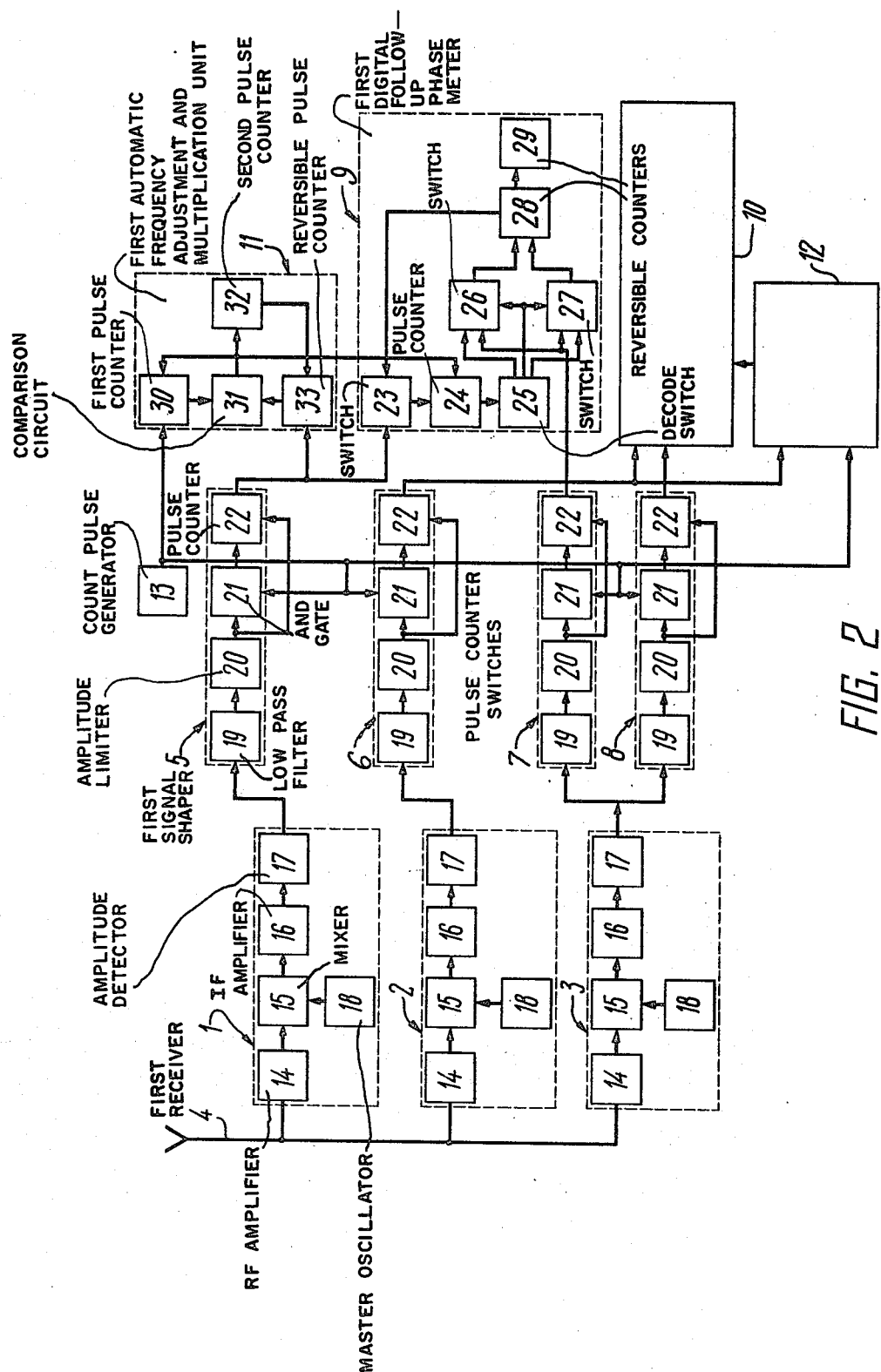
FIG. 2 is a detailed block diagram of the receiver-indicator according to the invention.

Each of the digital follow-up phase meters 9 and 10 (FIG. 2 is a schematic diagram of only one phase meter 9) comprises a switch 23 whose output is connected to the input of a pulse counter 24. The output of the pulse counter 24 is connected to the first and second inputs of switches 26 and 27 via a decoder 25. The outputs of the switches 26 and 27 are connected to the inputs of a first reversible counter 28. One output of the first reversible counter 28 is connected to the first input of the switch 23 and the other output of said first reversible counter is connected to the input of a second reversible counter 29. The third inputs of the switches 26 and 27 of the digital follow-up phase meters 9 and 10 are inputs of said follow-up phase meters and are connected to the outputs of the shapers 7 and 8, respectively; that is, to the outputs of the pulse counters 22. The second input of the switch 23 of the follow-up phase meters 9 and 10 is connected to the output of the shapers 9 and 10 of electric signals, respectively; that is, the outputs of the counters 22.

Each of the first and second automatic frequency adjustment units 11 and 12 (FIG. 2 is a schematic diagram of only the first unit 11) comprises a first pulse counter 30, a comparison circuit 31 whose first input is connected to the output of said first pulse counter and whose output is connected to the reset input of said first pulse counter. Each of the automatic frequency adjustment and multiplication units 11 and 12 also includes a second pulse counter 32 whose input is connected to the output of the comparison circuit 31 and a reversible pulse counter 33, the adding input of which is connected to the output of the second pulse counter 32 and the output of which is connected to the second input of the comparison circuit 31. The complementing input of the pulse counter 30 is an input of the digital frequency adjustment and multiplication units 11 and 12 and is connected to the output of the count pulse generator 13. The subtracting input of the reversible pulse counter 33 of the automatic frequency adjustment and multiplication units 11 and 12 is an input of said units and is connected to the outputs of the first and second signal shapers 5 and 6, respectively.

The two-channel receiver-indicator of phase radio systems of the invention operates as follows.

The signals of the transmitters of the phase incoherent heterodyne radio system are applied from the antenna 4 to the inputs of the receivers 1, 2 and 3 (FIG. 1). An electric signal produced at the outputs of the first and second receivers 1, 2 contains frequency components equal respectively to the beat frequency between the first guided and guiding stations and to the beat frequency between the second guided and guiding stations of the radio system.

An electric signal produced at the output of the third receiver 3 contains frequency components equal both to the beat frequency between the first guided and guiding stations and to the beat frequency between the second guided and guiding stations of the radio system.

The electric signals from the outputs of the receivers 1, 2 and 3 are fed to the inputs of the respective, signal shapers 5, 6, 7 and 8. The outputs of the first and third signal shapers 5 and 7 produces pulses with a repetition frequency corresponding to the beat frequency between the first guided and guiding stations of the radio system and the second and fourth signal shapers 6 and 8 produce output pulses with a repetition frequency corresponding to the beat frequency between the second guided and guiding stations of the radio system.

The first and second follow-up phase meter 9 and 10 connected to the outputs of the corresponding shapers 5, 6, 7 and 8 measure the phase difference between the signals shaped by the first and third and the second and fourth signal shapers 5 and 7, and 6 and 8.

The first and second digital automatic frequency adjustment and multiplication units 11 and 12 produce signals having a frequency N times higher than the frequency of the signals at the outputs of the signal shapers 5 and 7, where N is the base of the measuring units. The frequency multiplication conducted by the automatic units 11 and 12 permits the obtaining of readings of the digital follow-up phase meter 9 and 10 in a selected system of measuring units.

The automatic frequency adjustment and multiplication units 11 and 12 adjust the frequency of the count pulse generator 13 to the frequency of the signals being measured.

The system of the invention permits very accurate measurement of the phase difference within a wide band of frequencies of the signals to be analyzed. This provides high-accuracy measurements in phase heterodyne radio systems featuring low frequency stability of the radiated oscillations.

A detailed description of the operation of the receiver-indicator of FIG. 2 and its components is as follows.

The signals of radio transmitters of a phase incoherent radio system are fed from the antenna 4 to the inputs of the RF amplifiers 14 of the receivers 1, 2 and 3 which amplify the input signal. The signal is then fed to the mixers 15 of the receivers 1, 2 and 3 where an intermediate frequency is formed. The intermediate frequency is equal to the difference between the frequency of the output of the RF amplifier of the receivers 1, 2 and 3 and the frequency of the master oscillator 18 of said receivers. A first harmonic of the signals at the output of the mixer 15 of the receivers 1, 2 and 3 is produced at the output of the IF amplifiers 16 of said receivers.

An electric signal is produced at the output of the amplitude detector 17 of the first receiver 1. The frequency of the electric signal corresponds to the beats between the frequencies of the first guided and guiding stations of the radio system. An electric signal is produced at the output of the amplitude detector 17 of the second receiver 2. The frequency of this electric signal corresponds to the beats between the frequencies of the second guided and guiding stations of the radio system.

An electric signal is produced at the output of the amplitude detector 17 of the third receiver 3. The frequency components of this electric signal are equal both to the beat frequency between the first guided and guiding stations and to the beat frequency between the second guided and guiding stations of the radio system.

The low-pass filter 19 of the first and third signal shapers 5 and 7 isolates the first harmonic of the low-frequency oscillation with a frequency corresponding to the beat frequency between the first guided and guiding stations of the radio system. The low-pass filter 19 of the second and fourth signal shapers 6 and 8 isolates the first harmonic of the low-frequency oscillation with a frequency equal to the beat frequency between the second guided and guiding stations of the radio system. The amplitude limiters 20 of the signal shapers 5, 6, 7 and 8 produce square pulses of a corresponding repetition frequency fed to the input of the AND gates 21 of said shapers. During the positive half-wave, the AND gates 21 of the signal shapers 5, 6, 7 and 8 pass the count pulses of the generator 13 to the pulse counter 22 of the said shapers.

Each drop of the leading edge of the pulse due to the fluctuation of the signal produced by the amplitude limiters 20 of the signal shapers 5, 6, 7 and 8 resets the pulse counters 22 of said shapers and prevents them from completing the count of the pulses of the generator 13 to a value at which said pulse counters overflow. Only after the last pulse caused by the signal fluctuation is the count of the pulses of the pulse generator 13 brought to a value at which the pulse counters 22 of the signal shapers 5, 6, 7 and 8 overflow. Thus, once per period, an overflow pulse is produced at the outputs of the pulse counters 22 of the signal shapers 5, 6, 7 and 8. The overflow pulse corresponds to the leading edge of the signal, which is not subjected to fluctuation.

The automatic frequency adjustment and multiplication units 11 and 12 permanently follow the frequency of the measured signal, thereby widening the band of frequencies at which the phase difference of the electric signals is measured.

Due to the presence of a feedback between the comparison circuit 31 and the reversible pulse counter 33, the dynamic conditions are characterized by the same average number of the pulses fed to the adding and subtracting inputs of said reversible pulse counter of each of the automatic frequency adjustment and multiplication units.

The number K of pulses per unit time at the subtracting inputs of the reversible pulse counters 33 of the automatic frequency adjustment and multiplication unit 11 and 12 is defined as $K = \Delta f \cdot t$ where $\Delta f$ is the beat frequency formed by the radiation of one of the guided and guiding stations of the radio system. The number K of pulses at the adding inputs of the reversible pulse counters 33 of the automatic frequency adjustment and multiplication units 11 and 12 is defined as $$K = n N f_2$$

where $f_2$ is the repetition frequency of the pulses of the count pulse generator 13, n is the content of the reversible pulse counters 33 equal to the factor of division of the second pulse counters 32 of the automatic frequency adjustment and multiplication units 11 and 12, N is the base of the system of units for measuring the phase difference equal to the capacity of the second pulse counters 32 of the automatic frequency adjustment and multiplication units.

When $f_2/n = \Delta f \cdot N$, both inputs of the reversible counters 33 of the automatic frequency adjustment units 11 and 12 receive the same number of pulses. In this case, the content of the reversible counters 33 does not change, and pulses with a frequency $\Delta f \cdot N$ are produced at the outputs of the comparison circuits 31 of the automatic frequency adjustment and multiplication units 11 and 12.

The width of the band of the automatic frequency adjustment and multiplication units on which the phase difference is measured is defined only by such a parameter as the capacity of the reversible pulse counters 33 and the first pulse counters 30 of the automatic frequency adjustment and multiplication units 11 and 12 and also by the frequency of the count pulse generator 13. The band could thus be as large as desired dependent upon the respective parameters selected.

The pulse produced at the output of the signal shaper 5 and 6 renders conductive the electronic switches 23 of the digital follow-up phase meters 9 and 10. This sets the value of the reversible pulse counters 28 of the digital follow-up phase meters 9 and 10 in the pulse counters 24 of said meters. After the initial value has been set in the pulse counters 24 of the digital follow-up phase meters 9 and 10, the system starts counting the pulses produced at the outputs of the comparison circuits 31 of the automatic frequency adjustment and multiplication unit 11 and 12. The pulse counters 24 of the digital follow-up phase meters 9 and 10 count the number of pulses equal to the value for complementing the phase difference (1a), where a is the value corresponding to the phase difference, in fractions of one period. After that the output pulse of the signal shaper 7 and 8 is fed to the input of the electronic switches 26 and 27 of the digital follow-up phase meters 9 and 10. Dependent upon which switch 26 or 27 is rendered conductive, the pulse is fed either to the adding or the subtracting input of the pulse counters 24 of the digital follow-up phase meters 9 and 10. If the value of the phase difference corresponds to the random reading 1 of the first reversible pulse counters 28 of the digital follow-up phase meters 9 and 10, the pulse rendering the switches 23 conductive sets the value 1 in the pulse counters 24 of said digital follow-up meters. The number of pulses r is then calculated, and corresponds to the complement to the phase difference. The state of the pulse counters 24 of the digital follow-up phase meters 9 and 10 after the count, that is during the time necessary for the pulse to come from the output of the signal shaper 7 and 8, is equal to $1 + r = N$.

In this case, the decoders 25 of the digital follow-up phase meters 9 and 10 produce a pulse rendering the switches 26 and 27 non-conductive. In so doing, the state of the reversible counters 28 of the digital follow-up phase meters 9 and 10 remains unchanged.

If the value of the reversible counters 28 of the digital follow-up phase meters 9 and 10 exceeds that of the phase difference being measured, the value $1 + r$ of the pulse counters 24 of said digital follow-up phase meters 9 and 10 during the time of arrival of the pulse from the outputs of the signal shaper 7 and 8 is equal to m, where $m < 0.5$ N. The decoders 25 of the digital follow-up phase meters 9 and 10 in this case produce a potential permitting passage of the output pulses of the signal shapers 7 and 8 through the switches 26 of said phase meters to the subtracting input of the reversible counters of said phase meters, reducing its value to that corresponding to the reading of the measured phase difference.

The operation of the digital follow-up phase meters 9 and 10 at the initial values of the first reversible counters 28 lower than the value of the measured phase difference is effected in a similar way.

The second reversible counters 29 of the digital follow-up phase meters 9 and 10 record the overflow pulses of the first reversible counters 28 of said digital follow-up phase meters and are used for calculation of the complete phase cycles.

Thus, the above-described digital follow-up phase meters 9 and 10 follow the measurement of the phase difference at a speed defined by the frequency of the signals being measured. The phase difference being measured is always followed through the shortest path.

The digital follow-up phase meters 9 and 10 measure the phase difference within a single phase track and also register the quantity of the measured accurate tracks, or complete phase cycles, thus successively calculating the number of the accurate track.

The aforedescribed two-channel receiver-indicator of phase radio systems of the invention permits the measurement of the phase difference within a wide range of measured frequencies and with a high accuracy, thus providing accurate measurements at low frequency stability of the radiation of ground radio systems.

What is claimed is:

1. A two-channel receiver-indicator of phase radio systems including first and second guiding stations, first and second guided stations and a repeater station, said receiver-indicator comprising a first receiver tuned to the frequencies of the first guided station and a guiding station of a radio system, said first receiver having an output;

a second receiver tuned to the frequencies of the second guided station and said guiding station of said radio system, said second receiver having an output;

a third receiver tuned to the frequency of the repeater station of said radio system, said third receiver having an output;

a first signal shaper for shaping signals corresponding to the beat frequency between said first guided station and said guiding station, said first signal shaper having an input connected to the output of said first receiver and an output;

a second signal shaper for shaping signals corresponding to the beat frequency between said second guided station and said guiding station, said second signal shaper having an input connected to the output of said second receiver and an output;

a third signal shaper for shaping signals corresponding to the beat frequency between said first guided station and the first guiding station, said third signal shaper having an input connected to the output of said third receiver and an output;

a fourth signal shaper for shaping signals corresponding to the beat frequency between said second guided station and the second guiding station, said fourth signal shaper having an input connected to the output of said third receiver and an output;

a first digital follow-up phase meter having first and second inputs connected to the outputs of said first and third signal shapers, respectively, and a third input;

a second digital follow-up phase meter having first and second inputs connected to the outputs of said second and fourth signal shapers, respectively, and a third input;

a first digital unit for automatic adjustment and multiplication of a signal frequency, said first digital unit having a first input connected to the output of said first signal shaper, a second input and an output connected to the third input of said first digital follow-up phase meter;

a second digital unit for automatic adjustment and multiplication of a signal frequency, said second digital unit having a first input connected to the output of said second signal shaper, a second input and an output connected to the third input of said second digital follow-up phase meter; and a count pulse generator having an output connected to the second inputs of said first and second digital units.

2. A two-channel receiver-indicator of phase radio systems as claimed in claim 1, wherein each of said first and second digital units includes a first pulse counter having an input connected to the output of said count pulse generator and serving as an input of the unit, a reset input and an output, a comparison circuit having a first input connected to the output of said first pulse counter, a second input and an output connected to the reset input of said first pulse counter, a second pulse counter having an input connected to the output of said comparison circuit and an output, and a reversible pulse counter having a subtracting input connected to the output of a signal shaper and serving as another input of said unit, an adding input connected to the output of said second pulse counter and an output connected to the second input of said comparison circuit.

3. A two-channel receiver-indicator of phase radio systems as claimed in claim 1, wherein each of said first and second digital units includes a first switch having a first input connected to the output of a signal shaper, a second input and an output, a pulse counter having a first input connected to the output of said first switch, a second input and an output, a decoder having an input connected to the output of said pulse counter and first, second and third outputs, a second switch having a first input connected to the first output of said decoder, a second input connected to the output of another signal shaper, a third input connected to the second output of said decoder and an output, a third switch having a first input connected to the output of said other signal shaper, a second input connected to the third output of said decoder, a third input connected to the second output of said decoder and an output, a first reversible counter having a first input connected to the output of said second switch, a second input connected to the output of said third switch, a first output connected to the second input of said first switch and to the second input of said pulse counter and a second output, and a second reversible counter having an input connected to the second output of said first reversible counter.

* * * * *